United States Patent
Tapily

(10) Patent No.: US 10,529,584 B2
(45) Date of Patent: Jan. 7, 2020

(54) IN-SITU SELECTIVE DEPOSITION AND ETCHING FOR ADVANCED PATTERNING APPLICATIONS

(71) Applicant: Tokyo Electron Limited, Minato-ku, Tokyo (JP)

(72) Inventor: Kandabara N. Tapily, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/980,274

(22) Filed: May 15, 2018

(65) Prior Publication Data
US 2018/0330963 A1    Nov. 15, 2018

Related U.S. Application Data

(60) Provisional application No. 62/506,299, filed on May 15, 2017, provisional application No. 62/528,061, filed on Jul. 1, 2017.

(51) Int. Cl.
| | | |
|---|---|---|
| H01L 21/311 | (2006.01) | |
| H01L 21/02 | (2006.01) | |
| H01L 21/3213 | (2006.01) | |
| H01L 21/033 | (2006.01) | |

(Continued)

(52) U.S. Cl.
CPC .... *H01L 21/31122* (2013.01); *H01L 21/0228* (2013.01); *H01L 21/02178* (2013.01); *H01L 21/02186* (2013.01); *H01L 21/02194* (2013.01); *H01L 21/0337* (2013.01);
(Continued)

(58) Field of Classification Search
CPC ......... H01L 21/02172; H01L 21/02178; H01L 21/02186; H01L 21/02194; H01L 21/0228; H01L 21/30604; H01L 21/308; H01L 21/31116; H01L 21/31122; H01L 21/31144; H01L 21/32135; H01L 21/465;
(Continued)

(56) References Cited

U.S. PATENT DOCUMENTS

| | | |
|---|---|---|
| 4,902,645 A | 2/1990 | Ohba |
| 5,861,233 A | 1/1999 | Sekine et al. |

(Continued)

OTHER PUBLICATIONS

Korean Intellectual Property Office, International Search Report and Written Opinion for international patent application No. PCT/US2018/032743, dated Sep. 5, 2018, 12 pages.

*Primary Examiner* — Stephen W Smoot

(57) ABSTRACT

Embodiments of the invention provide a method for in-situ selective deposition and etching for advanced patterning applications. According to one embodiment the method includes providing in a process chamber a substrate having a metal-containing layer thereon, and exposing the substrate to a gas pulse sequence to etch the metal-containing layer in the absence of a plasma, where the gas pulse sequence includes, in any order, exposing the substrate to a first reactant gas containing a halogen-containing gas, and exposing the substrate to a second reactant gas containing an aluminum alkyl. According to another embodiment, the substrate has an exposed first material layer and an exposed second material layer, and the exposing to the gas pulse sequence selectively deposits an additional material layer on the exposed first material layer but not on the exposed second material layer.

20 Claims, 3 Drawing Sheets

(51) Int. Cl.
*H01L 21/306* (2006.01)
*H01L 21/471* (2006.01)

(52) U.S. Cl.
CPC .. *H01L 21/30604* (2013.01); *H01L 21/32135* (2013.01); *H01L 21/471* (2013.01)

(58) Field of Classification Search
CPC ... H01L 21/471; H01L 21/473; H01L 21/475; H01L 21/76834
See application file for complete search history.

(56) References Cited

U.S. PATENT DOCUMENTS

| | | | |
|---|---|---|---|
| 7,157,385 B2 * | 1/2007 | Derderian | C23C 16/0272 |
| | | | 257/E21.279 |
| 9,147,737 B2 * | 9/2015 | Chen | H01L 29/401 |
| 2011/0151660 A1 * | 6/2011 | Harada | C23C 16/34 |
| | | | 438/652 |
| 2011/0198736 A1 * | 8/2011 | Shero | B82Y 30/00 |
| | | | 257/629 |
| 2014/0051256 A1 | 2/2014 | Zhong et al. | |
| 2014/0273510 A1 * | 9/2014 | Chen | H01L 21/02337 |
| | | | 438/763 |
| 2016/0379842 A1 | 12/2016 | Kal et al. | |
| 2017/0117195 A1 | 4/2017 | Adderly et al. | |
| 2017/0243755 A1 * | 8/2017 | Tapily | H01L 21/31116 |
| 2018/0182597 A1 * | 6/2018 | Blomberg | C23G 5/00 |
| 2018/0294181 A1 * | 10/2018 | Tapily | H01L 21/76224 |

\* cited by examiner

IN-SITU SELECTIVE DEPOSITION AND ETCHING FOR ADVANCED PATTERNING APPLICATIONS

CROSS-REFERENCE TO RELATED APPLICATIONS

This application is related to and claims priority to U.S. Provisional Patent Application Ser. No. 62/506,299, filed on May 15, 2017, the entire contents of which are herein incorporated by reference. This application is also related to and claims priority to U.S. Provisional Patent Application Ser. No. 62/528,061, filed on Jul. 1, 2017, the entire contents of which are herein incorporated by reference.

FIELD OF THE INVENTION

The present invention relates to semiconductor processing and semiconductor devices, and more particularly, to in-situ selective deposition and etching for advanced patterning applications.

BACKGROUND OF THE INVENTION

As smaller transistors are manufactured, the critical dimension (CD) or resolution of patterned features is becoming more challenging to produce. Sub 10 nm technology nodes require stringent thickness, uniformity and almost no margin or variation at the atomic level to design specifications. Self-aligned patterning needs to replace overlay-driven patterning so that cost-effective scaling can continue even after EUV introduction. Selective etching and deposition of thin films is a key step in patterning highly scaled technology nodes.

SUMMARY OF THE INVENTION

Embodiments of the invention provide a method for in-situ selective deposition and etching for advanced patterning applications. According to one embodiment the method includes providing in a process chamber a substrate having a metal-containing layer thereon, and exposing the substrate to a gas pulse sequence to etch the metal-containing layer in the absence of a plasma, where the gas pulse sequence includes, in any order: exposing the substrate to a first reactant gas containing a halogen-containing gas, and exposing the substrate to a second reactant gas containing an aluminum alkyl.

According to another embodiment, the method includes providing in a process chamber a substrate having an exposed first material layer and an exposed second material layer, and exposing the substrate to a gas pulse sequence to selectively deposit an additional material layer on the exposed first material layer but not on the exposed second material layer, where the gas pulse sequence includes, in any order, exposing the substrate to a first reactant gas containing a halogen-containing gas, and exposing the substrate to a second reactant gas containing an aluminum alkyl. According to one embodiment, the exposing the substrate to the gas pulse sequence etches the second material layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
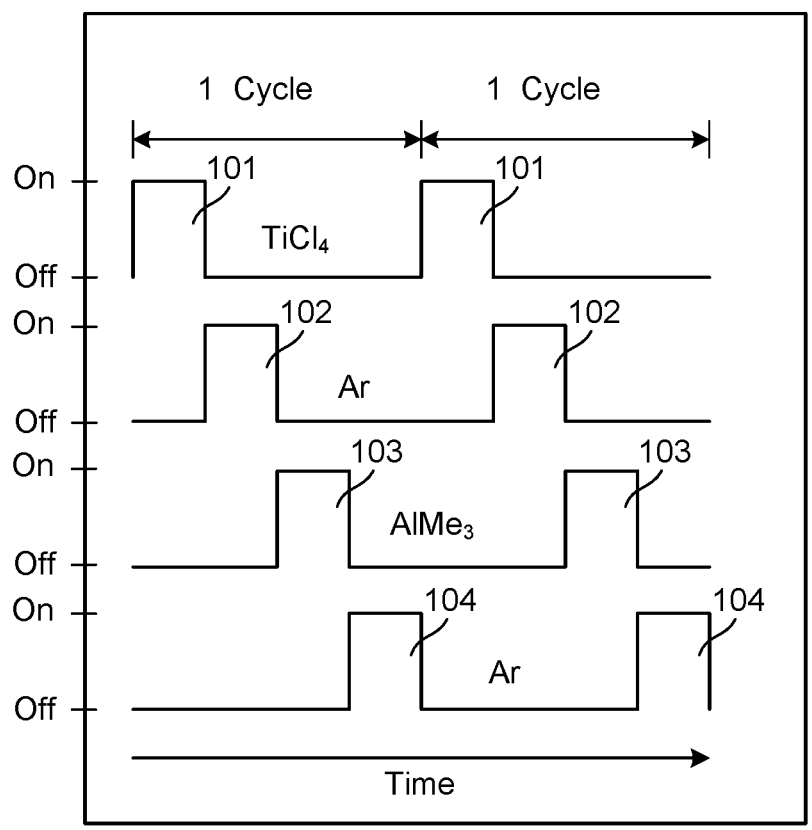
FIG. 1 schematically shows a gas pulse sequence for processing a substrate according to an embodiment of the invention.

Embodiments of the invention describe a method that includes exposing films on a substrate to a gas pulse sequence. According to one embodiment, the method may be used to thermally etch metal-containing layers. According to another embodiment, the method may be used to selectively etch metal-containing layers while simultaneously depositing a material on other metal-containing layers. The method may be integrated into semiconductor manufacturing. In one example, the thermal etching process may be integrated into gate stack formation and patterning. In another example, the thermal etching process may be used to for precise film thickness control in order to tuning device work function.

Some embodiments of the invention describe an isotropic thermal atomic layer etching (ALE) process for etching metal-containing layers. Examples of the metal-containing material include Hf-containing compounds such as hafnium oxides (e.g., $HfO_2$), hafnium nitrides (e.g., HfN), Zr-containing compounds such as zirconium oxides (e.g., $ZrO_2$) and zirconium nitrides (e.g., ZrN), and Ti-containing compounds such as titanium oxides (e.g., $TiO_2$) and titanium nitrides (e.g., TiN). Some of the metal oxides (e.g., $TiO_2$, $HfO_2$, and $ZrO_2$) have been identified as promising high-k dielectric materials for advanced semiconductor devices. In one example, $HfO_2$ is currently used in semiconductor devices as a gate dielectric material.

According to one embodiment, the method includes providing in a process chamber a substrate having a metal-containing layer thereon, and exposing the substrate to a gas pulse sequence to etch the metal-containing layer in the absence of a plasma, where the gas pulse sequence includes, in any order, exposing the substrate to a first reactant gas contain a halogen-containing gas, and exposing the substrate to a second reactant gas containing an aluminum alkyl. The gas pulse sequence may be repeated at least once to further etch the metal-containing layer. According to one embodiment, the method further includes purging the process chamber with an inert gas between the steps of exposing the substrate to the first reactant gas and the second reactant gas.

According to one embodiment, the halogen-containing gas includes a titanium halide selected from the group consisting of $TiF_4$, $TiCl_4$, $TiBr_4$, and $TiI_4$. According to another embodiment, the halogen-containing gas may be selected from the group consisting of $SiCl_4$, $BCl_3$, and $CCl_4$. According to one embodiment, the aluminum alkyl may be selected from the group consisting of trimethylaluminum ($AlMe_3$), triethylaluminum ($AlEt_3$), tripropylaluminum ($AlPr_3$), and tributylaluminum ($AlBu_3$). Other embodiments include the use of aluminum alkyls with mixed ligands, for example $AlMe_2Et$ or $AlMeEt_2$. According to some embodiments, the substrate temperature can be between about 200° C. and less than 500° C., or between about 300° C. and about 400° C. The exposures to the halogen-containing gas and the aluminum alkyl may both be saturation exposures that saturate the substrate surfaces with the halogen-containing gas and the aluminum alkyl.

FIG. 1 schematically shows a gas pulse sequence for processing a substrate according to an embodiment of the invention. The gas pulse sequence includes cycles of sequential reactant gas pulses in the absence of plasma excitation. Each cycle includes a first reactant gas pulse 101 containing a halogen containing gas, a purge gas pulse 102 (e.g., Ar), a second reactant gas pulse 103 containing an aluminum alkyl, and a purge gas pulse 104 (e.g., Ar). The first reactant pulse 101 and the second reactant gas pulse 103 may further contain an inert gas. According to another embodiment, the one of more of the purge gas pulses 102 and 104 may be omitted.

Substrate Processing Examples

TiN films on substrates were processed according to an embodiment of the invention. The TiN films were processed using a plurality of cycles of sequential exposures of $TiCl_4$, Ar, $AlMe_3$, and Ar. The $TiCl_4$ pulse lengths were 5 seconds and the $AlMe_3$ pulse lengths were 6 seconds. Both the $TiCl_4$ pulses and the $AlMe_3$ pulses were saturation exposures and the substrate temperature was 350° C. The thickness of the TiN films was measured by X-ray Photoelectron Spectroscopy (XPS) following 0, 50, 150, and 250 cycles. The etch rate of the TiN films was about 0.1 Å/cycle.

$HfO_2$ films on substrates were processed according to an embodiment of the invention. The $HfO_2$ films were processed using cycles of sequential exposures of $TiCl_4$, Ar, $AlMe_3$, and Ar. The $TiCl_4$ pulse lengths were 5 seconds and the $AlMe_3$ pulse lengths were 6 seconds. Both the $TiCl_4$ pulses and the $AlMe_3$ pulses were saturation exposures and the substrate temperature was 350° C. The thickness of the $HfO_2$ films was measured by XPS following 0, 20, 50, and 100 cycles. The etch rate of the $HfO_2$ films was about 0.37 Å/cycle.

$ZrO_2$ films on substrates were processed according to an embodiment of the invention. The $ZrO_2$ films were processed using cycles of sequential exposures of $TiCl_4$, Ar, $AlMe_3$, and Ar. The $TiCl_4$ pulse lengths were 5 seconds and the $AlMe_3$ pulse lengths were 6 seconds. Both the $TiCl_4$ pulses and the $AlMe_3$ pulses were saturation exposures and the substrate temperature was 350° C. The thickness of the $ZrO_2$ films was measured by XPS following 0, 20, 50, and 100 cycles. The etch rate of the $ZrO_2$ films was about 0.5 Å/cycle.

Figure 2:
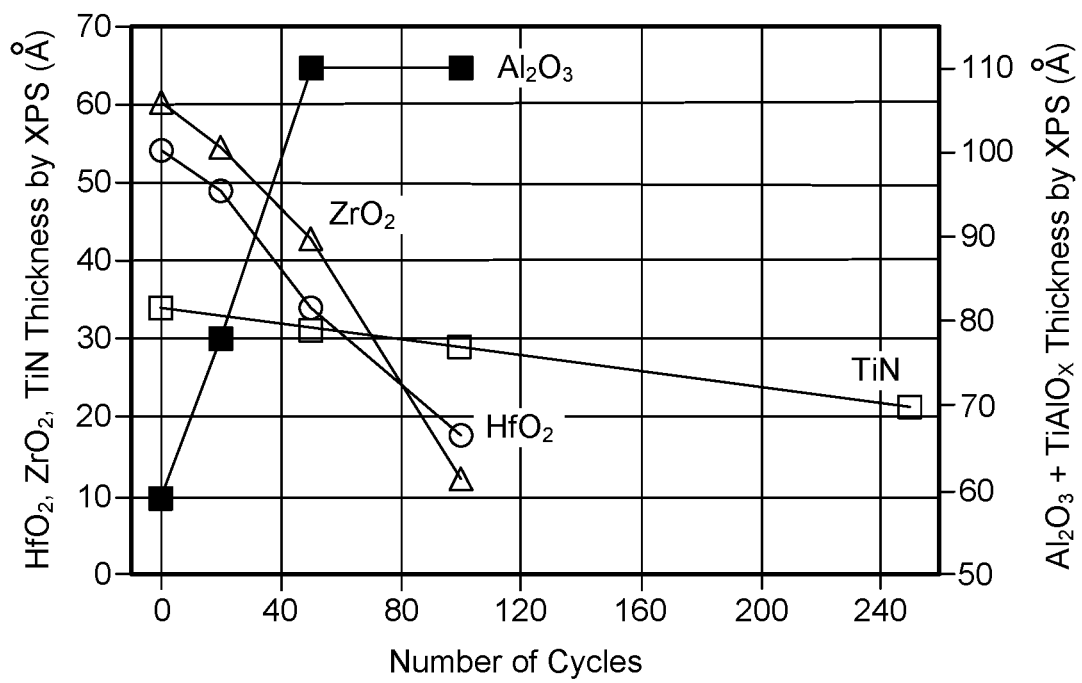
FIG. 2 shows experimental results for processing a substrate according to embodiments of the invention.

FIG. 2 shows experimental results for processing a substrate according to embodiments of the invention. The results for etching the TiN, $HfO_2$, and $ZrO_2$ films described above are shown and also experimental results for processing $Al_2O_3$ films on a substrate. The $Al_2O_3$ films were processed using cycles of sequential exposures of $TiCl_4$, Ar, $AlMe_3$, and Ar, shown in FIG. 1. The $TiCl_4$ pulse lengths were 5 seconds and the $AlMe_3$ pulse lengths were 6 seconds. The substrate temperature was 350° C. The experimental results in FIG. 2 show that $HfO_2$ films, $ZrO_2$ films, and TiN are etched by the gas exposures, whereas the $Al_2O_3$ films were not etched and elemental analysis showed that $TiAlO_x$ material was deposited on the $Al_2O_3$ films.

According to one embodiment, the thermal etching process may be used to maintain selectivity in area selective deposition for hard mask deposition and vertical dielectric growth. According to one embodiment, a starting substrate may contain a metal-containing material that is inlaid in a dielectric material. Examples of the metal-containing material include metals such as tungsten (W), ruthenium (Ru), cobalt (Co), and copper (Cu). Examples of the dielectric material may include $SiO_2$, SiON, SiN, SiCN, and spin-on oxides. The starting substrate may be pre-treated using $H_2$ exposure, annealing, and a combination thereof. Thereafter, in one example, the starting substrate may be exposed to a reactant gas that forms self-assembled monolayers of an organic compound on the metal-containing material to facilitate enhanced subsequent selective deposition on the dielectric material. Thereafter, a metal-containing layer may be at least substantially selectively deposited on the dielectric material. In one example, the metal-containing layer may be deposited by atomic layer deposition (ALD). A small amount of additional metal-containing layer may be deposited at nucleation sites on the metal-containing material. The amount of additional metal-containing layer is less than the amount of the metal-containing layer but the additional metal-containing material may need to be removed in order to maintain selectivity in the area selective deposition. Thus, the additional metal-containing layer on the metal-containing material may be removed by the thermal etching process described above using a first reactant gas containing a halogen-containing gas, and a second reactant gas containing an aluminum alkyl. Thereafter, the depositing of the metal-containing layer and thermal etching may be repeated at least once.

According to one embodiment, the thermal etching process may be used for work function tuning. In semiconductor devices, work function tuning by setting the threshold voltage (Vt) is critical for transistor operation. One method for controlling the work function is through the gate stack thickness. However, with scaled nodes, available space on the device is a significant problem and this can require a stack with multiple gate metals. In one example, a partially manufactured device contains two gate structures having an initial metal-containing layer (e.g., TiN) on a high-k layer or a higher-k oxide (higher k than $SiO_2$). The method includes removing or thinning the initial metal-containing layer from one gate structure by forming a patterned masking layer and thereafter performing a thermal etching process described above. Thereafter, the masking layer may be removed and an additional metal-containing layer deposited on the substrate, thereby forming a first gate structure having the additional metal-containing layer, and a second gate structure having the initial metal-containing layer and the additional metal-containing layer. The initial metal-containing layer and the additional metal-containing layer may be selected so that the two gate structures have different work functions. In one example, the depositing of the initial and additional metal-containing layers and the thermal etching process may be performed in the same process chamber using the same or similar substrate temperature.

Figure 3A:
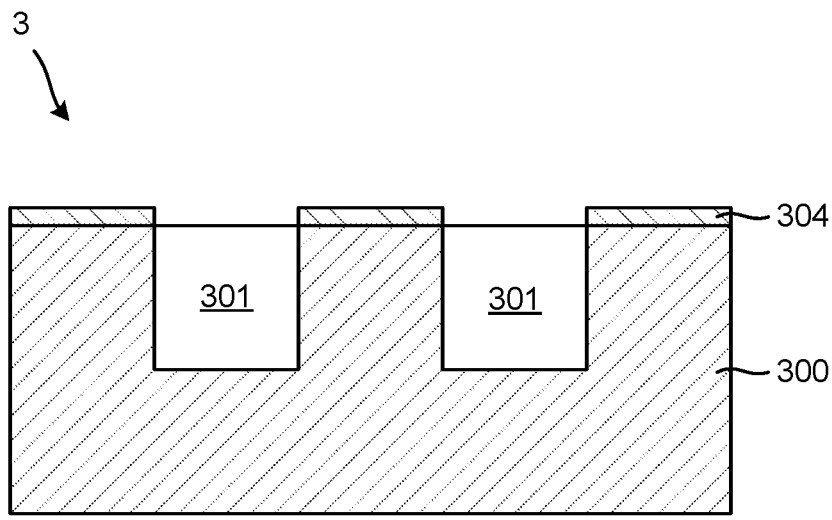
FIGS. 3A and 3B schematically shows selective deposition and etching according to an embodiment of the invention.
Figure 3B:
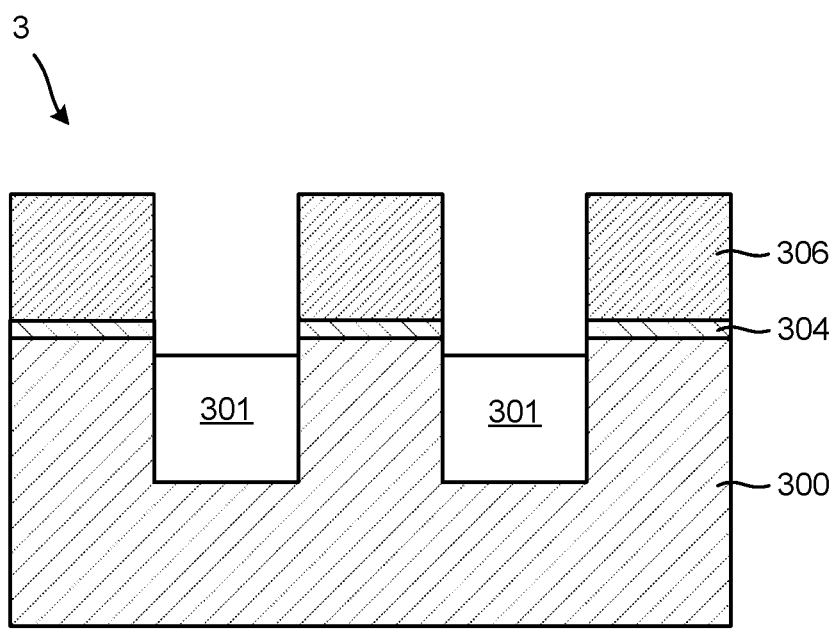

Some embodiments of the invention provide a method for in-situ selective deposition and etching for advanced patterning applications. FIGS. 3A and 3B schematically shows selective deposition and etching according to an embodiment of the invention. In one example, a patterned substrate 3 in FIG. 3A contains recessed features in a film 300 (e.g., a dielectric) that are filled with a second material layer 301 (e.g., TiN) and a first material layer 304 (e.g., $Al_2O_3$) that is selectively formed on the film 300 but not on the second material layer 301. FIG. 3B shows the resulting structure following exposure of the patterned substrate 3 to a gas pulse sequence containing alternating exposures of a first reactant gas containing a halogen-containing gas, and a second reactant gas containing an aluminum alkyl. The gas pulse exposure selectively deposits a layer of TiAlO$_x$ on the exposed first material layer 304 and but the exposed second material layer 301 is etched to recess the second material layer 301. In one example, the exposed first material layer 304 contains Al metal, Al$_2$O$_3$, AlN, or a combination thereof. In one example, the exposed second material layer 301 contains TiO$_2$, TiN, HfO$_2$, HfN, ZrO$_2$, ZrN, or a combination thereof.

According to one embodiment, a method is provided for selective deposition and etching for multicolor patterning. Multicolor patterning refers to selective etching of different materials, and thereafter, using the resulting pattern to etch one or more underlying layers. The selective etching and deposition may be carried out using the gas pulse sequence containing alternating exposures of a first reactant gas containing a halogen-containing gas and a second reactant gas containing an aluminum alkyl.

Figure 4A:
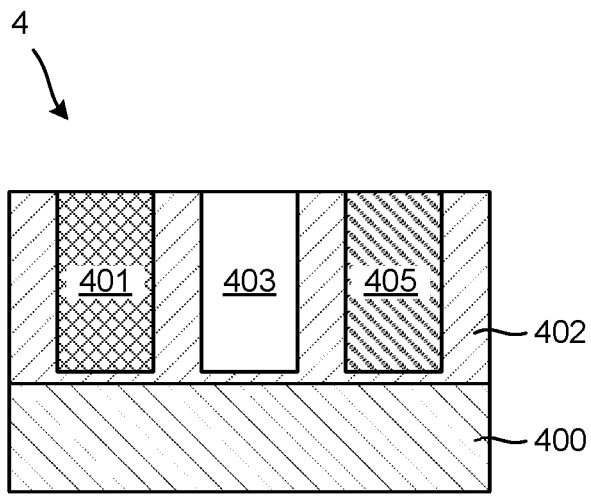
FIGS. 4A and 4B schematically show an exemplary method for selective deposition and etching for multicolor patterning according to an embodiment of the invention.
Figure 4B:
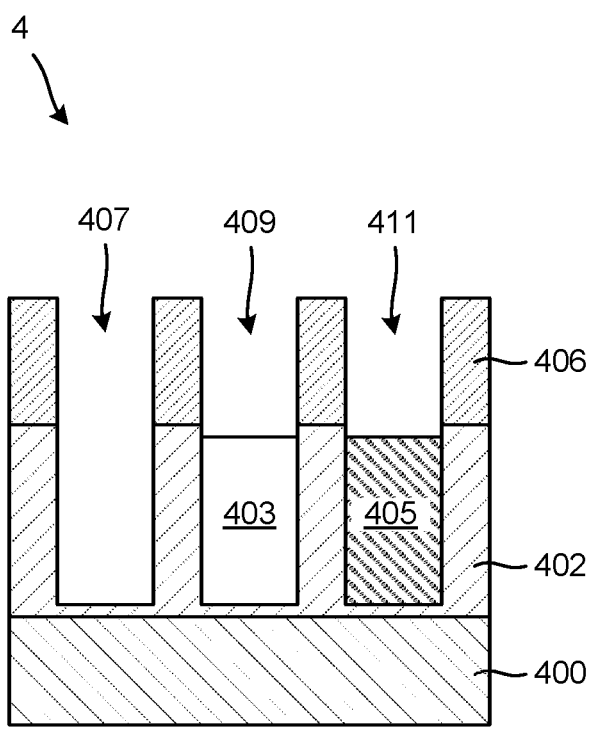

FIGS. 4A and 4B schematically show an exemplary method for selective deposition and etching for multicolor patterning according to an embodiment of the invention. In FIG. 4A, a planarized patterned substrate 4 contains, from left to right, alternating materials 402, 401, 402, 403, 402, 405, 402. The alternating materials may also be referred to as ABACADA, or multicolors. In one example, the material 402 contains Al$_2$O$_3$, the material 401 contains HfO$_2$ or ZrO$_2$, the material 403 contains TiN, and the material 405 contains TiO$_2$. According to one embodiment, the substrate 4 may be exposed to a gas pulse sequence containing alternating exposures of a first reactant gas containing a halogen-containing gas, and a second reactant gas containing an aluminum alkyl to selectively remove the material 401 (e.g., HfO$_2$), partially etch the material 403 (e.g., TiN) and the material 405 (e.g., TiO$_2$), and selectively deposit a film 406 (e.g., TiAlO$_x$) on the material 402 (e.g., Al$_2$O$_3$). This selective deposition/etching process forms recessed features 407, 409 and 411 and can replace complex lithography patterning steps. The resulting substrate 4 may be further processed by etching underlying layers (i.e., that base layer 400) according to the new pattern where the material 401 (e.g., HfO$_2$) has been selectively removed.

A plurality of embodiments for in-situ selective deposition and etching for advanced patterning applications have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of processing a substrate, the method comprising:
    providing in a process chamber a substrate having a metal-containing layer thereon; and
    exposing the substrate to a gas pulse sequence to etch the metal-containing layer in the absence of a plasma, wherein the gas pulse sequence includes, in any order:
        exposing the substrate to a first reactant gas containing a halogen-containing gas, wherein the halogen-containing gas includes a titanium halide selected from the group consisting of TiF$_4$, TiCl$_4$, TiBr$_4$, and TiI$_4$, and
        exposing the substrate to a second reactant gas containing an aluminum alkyl.

2. The method of claim 1, wherein the metal-containing layer contains TiO$_2$, TiN, HfO$_2$, HfN, ZrO$_2$, ZrN, or a combination thereof.

3. The method of claim 1, wherein the aluminum alkyl is selected from the group consisting of AlMe$_3$, AlEt$_3$, AlPr$_3$, and AlBu$_3$.

4. The method of claim 1, wherein a temperature of the substrate is between about 300° C. and about 500° C.

5. A method of processing a substrate, the method comprising:
    providing in a process chamber a substrate having an exposed first material layer and an exposed second material layer; and
    exposing the substrate to a gas pulse sequence to selectively deposit an additional material layer on the exposed first material layer but not on the exposed second material layer, wherein the gas pulse sequence includes, in any order,
        exposing the substrate to a first reactant gas containing a halogen-containing gas, and
        exposing the substrate to a second reactant gas containing an aluminum alkyl.

6. The method of claim 5, wherein the exposed first material layer contains aluminum.

7. The method of claim 5, wherein the exposed first material layer contains Al metal, Al$_2$O$_3$, AlN, or a combination thereof.

8. The method of claim 5, wherein the exposed second material layer contains TiO$_2$, TiN, HfO$_2$, HfN, ZrO$_2$, ZrN, or a combination thereof.

9. The method of claim 5, wherein the halogen-containing gas is selected from the group consisting of SiCl$_4$, BCl$_3$, and CCl$_4$.

10. The method of claim 5, wherein the halogen-containing gas includes a titanium halide selected from the group consisting of TiF$_4$, TiCl$_4$, TiBr$_4$, and TiI$_4$.

11. The method of claim 5, wherein the aluminum alkyl is selected from the group consisting of AlMe$_3$, AlEt$_3$, AlPr$_3$, and Al(i-Bu)$_3$.

12. The method of claim 5, wherein a temperature of the substrate is between about 300° C. and about 500° C.

13. The method of claim 5, wherein the additional material layer includes TiAlO$_x$.

14. The method of claim 5, wherein the exposing the substrate to the gas pulse sequence etches the second material layer.

15. A method of processing a substrate, the method comprising:
    providing in a process chamber a substrate containing an exposed metal-containing material and an exposed dielectric material;
    depositing a metal-containing layer on the dielectric material and an additional metal-containing layer on the metal-containing layer, wherein the amount of the additional metal-containing layer is less than the amount of the metal-containing layer; and
    exposing the substrate to a gas pulse sequence to remove the additional metal-containing layer from the metal-containing layer in the absence of a plasma, wherein the gas pulse sequence includes, in any order, exposing the substrate to a first reactant gas containing a halogen-containing gas, and exposing the substrate to a second reactant gas containing an aluminum alkyl.

16. The method of claim 15, wherein the metal-containing layer contains $TiO_2$, TiN, $HfO_2$, HfN, $ZrO_2$, ZrN, or a combination thereof.

17. The method of claim 15, wherein the halogen-containing gas includes a titanium halide selected from the group consisting of $TiF_4$, $TiCl_4$, $TiBr_4$, and $TiI_4$.

18. The method of claim 15, wherein the aluminum alkyl is selected from the group consisting of $AlMe_3$, $AlEt_3$, $AlPr_3$, and $Al(i-Bu)_3$.

19. The method of claim 15, wherein the metal-containing material contains Al metal, $Al_2O_3$, AlN, or a combination thereof.

20. The method of claim 15, wherein the halogen-containing gas is selected from the group consisting of $SiCl_4$, $BCl_3$, and $CCl_4$.

* * * * *